United States Patent
Bajt et al.

(10) Patent No.: US 6,229,652 B1
(45) Date of Patent: *May 8, 2001

(54) HIGH REFLECTANCE AND LOW STRESS $MO_2C/BE$ MULTILAYERS

(75) Inventors: Sasa Bajt, Livermore; Troy W. Barbee, Jr., Palo Alto, both of CA (US)

(73) Assignee: The Regents of the University of California, Oakland, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/200,163

(22) Filed: Nov. 25, 1998

(51) Int. Cl.$^7$ ................................. G02B 1/10; F21V 9/04
(52) U.S. Cl. ......................... 359/584; 359/359; 359/360; 359/585
(58) Field of Search .................... 359/359, 360, 359/584, 585; 378/84, 845 M

(56) References Cited

U.S. PATENT DOCUMENTS 5,022,726 * 6/1991 Austin et al. ................... 359/360
5,052,003 * 9/1991 Ikeda et al. ..................... 378/84

* cited by examiner

Primary Examiner—Cassandra Spyrou
Assistant Examiner—Jennifer Winstedt
(74) Attorney, Agent, or Firm—Alan H. Thompson; L. E. Carnahan

(57) ABSTRACT

A material for extreme ultraviolet (EUV) multilayers that will reflect at about 11.3 nm, have a high reflectance, low stress, and high thermal and radiation stability. The material consists of alternating layers of $Mo_2C$ and Be deposited by DC magnetron sputtering on a substrate, such as silicon. In one example a $Mo_2C$/Be multilayer gave 65.2% reflectance at 11.25 nm measured at 5 degrees off normal incidence angle, and consisted of 70 bilayers with a deposition period of 5.78 nm, and was deposited at 0.83 mTorr argon (Ar) sputtering pressure, with the first and last layers being Be. The stress of the multilayer is tensile and only +88 MPa, compared to +330 MPa of a Mo/Be multilayers of the same thickness. The $Mo_2C$/Be multilayer was capped with carbon which produced an increase in reflectivity of about 7% over a similar multilayer with no carbon capping material, thus raising the reflectivity from 58.3% to over 65%. The multilayers were formed using either $Mo_2C$ or Be as the first and last layers, and initial testing has shown the formation of beryllium carbide at the interfaces between the layers which both stabilizes and has a smoothing effect, and appear to be smoother than the interfaces in Mo/Be multilayers.

19 Claims, 3 Drawing Sheets

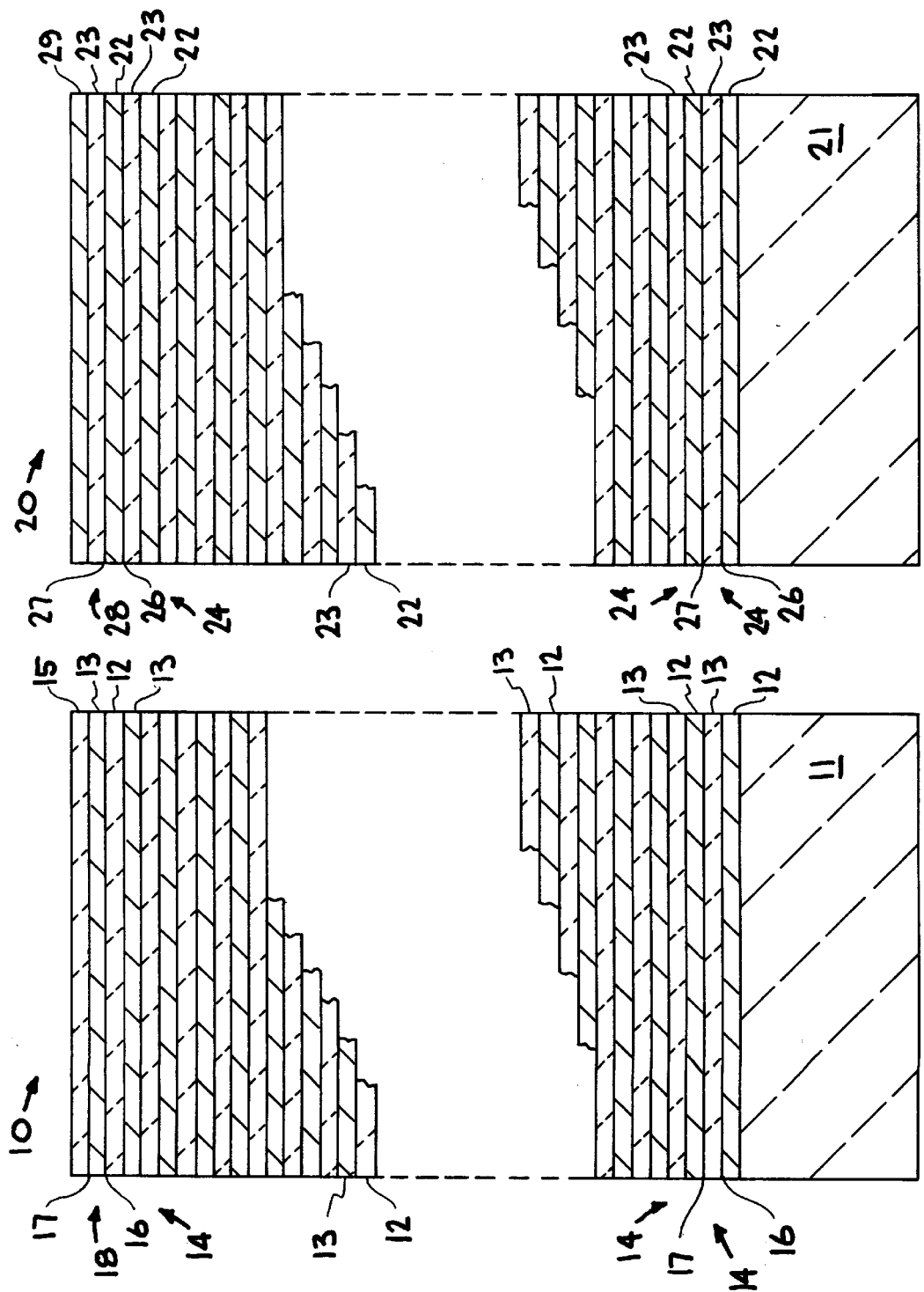

HIGH REFLECTANCE AND LOW STRESS Mo$_2$C/BE MULTILAYERS

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to multilayer reflective films, particularly to high reflectance and low stress multilayer films, and more particularly to Mo$_2$C/Be multilayers having low stress and high reflectance, and which may include a carbon capping layer.

Multilayer reflective mirrors for soft x-ray to ultraviolet wavelength have been under development for several decades. These early multilayer efforts involved layers of a transition metal and layers of a compound of carbon and silicon, boron, beryllium, or aluminum, and resulted in a reflectance of about 55%. Such a multilayer system is exemplified by U.S. Pat. No. 5,310,603, issued May 10, 1994 to Y. Fukuda et al.

In recent years, extensive efforts have been directed to the development of extreme ultraviolet (EUV) lithography tools or systems which operate in the 11–13 nm wavelength regime. Such systems require several precisely figured, low roughness optics coated with highly reflective multilayers. To obtain sufficient throughput and image quality, these multilayer coatings should simultaneously have high reflectance, preferably near 70%, and low stress (less than 100 MPa), and have high thermal and radiation stability.

Until recently, the only multilayer material pair that would reflect near 11 nm and appear to have the potential to satisfy the requirement for high reflectance, low stress, and long term stability, was Mo/Be. However, this material combination had problems relative to long term stability and stress. The Mo/Be multilayer development efforts are exemplified by: K. M. Skulina et al., Molybdenum/beryllium multilayer mirrors for normal incidence in the extreme ultraviolet, Applied Optics 34, 3727 (1995); D. G. Stearns et al., "Beryllium-based multilayer structures, Mat. Res. Soc. Symp. Proc. 382, 329 (1995) Materials Research Society; T. W. Barbee Jr. et al., Interfacial Effects in Multilayers, SPIE 1997; and C. Montcalm et al., Multilayer reflective coatings for extreme-ultraviolet lithography, Emerging Lithography Technologies II, Y. Vladimirsky, ed., Proc. Soc. Opt. Instrum. Eng. 3331, paper 331–05 (1998).

The present invention involves a new material pair (Mo$_2$C and Be) to make EUV multilayer coatings. The Mo$_2$C layers are nano-crystalline (amorphous). The formation of a beryllium carbide at the Mo$_2$C/Be interfaces both stabilizes and has a smoothing effect on the interface. Tests have indicated that the interfaces appear to be smoother than the interfaces in Mo/Be multilayers, and such interfaces are expected to be more stable, based on the Mo$_2$C/Si study by T. W. Barbee Jr. et al., referenced above. To reduce the reduction in reflectance due to oxidation of the outer layer, a carbon capping layer is deposited, which has been shown to increase the reflectivity by about 7%, as compared to the multilayer where the outer layer has been oxidized. The reflectance of the carbon capped Mo$_2$C/Be multilayers is above 65% at 11.25 nm with a tensile stress of +88 MPa, compared to a stress of +330 MPa of Mo/Be multilayers of the same thickness. The Mo$_2$C/Be multilayer system of the present invention can be deposited using first and last Be layers, or a first layer of Be and last Mo$_2$C layer and capping the Mo$_2$C layer with a thin carbon layer.

SUMMARY OF THE INVENTION

It is an object of the present invention to provide a high reflectance, low stress multilayer optic.

A further object of the invention is to provide multilayers composed Of Mo$_2$C and Be.

A further object of the invention is to provide high reflectance, low stress multilayers that reflect at about 11.1 to 11.5 nm composed of Mo$_2$C/Be.

Another object of the invention is to provide Mo$_2$C/Be multilayer with a carbon capping layer.

Another object of the invention is to provide high reflectance, low stress multilayers composed of Mo$_2$C and Be, wherein the Be is deposited first and last.

Another object of the invention is to provide multilayers having a stress of less than 100 MPa composed of layers of Mo$_2$C and Be, wherein a Be layer is deposited first and a Mo$_2$C layer is deposited last, with a thin carbon capping layer whereby reflectance is above 65%.

Other objects and advantages of the present invention will become apparent from the following description and accompanying drawing. The present invention provides high reflectivity and low stress multilayers that reflect in the EUV region at wavelengths, just above the BeK absorption edge. The invention involves a new material pair combination that reflects at about 11.1–11.5 nm, measured at 5 degrees off normal incidence angle with a stress of only +88 MPa, and which may include a carbon capping layer for increasing the reflectivity to above 65%. Mo$_2$C/Be multilayers can have a reflectivity in the 65–70% range depending on the bilayer composition and if a capping layer is utilized. The material pair combination of this invention may be deposited with the Be first and last, or with the Be first and the Mo$_2$C last, followed by a thin carbon capping layer.

BRIEF DESCRIPTION OF THE DRAWINGS

The accompanying drawings, which are incorporated into and form a part of the disclosure, illustrate embodiments of the invention and, together with the description, serve to explain the principles of the invention.

FIG. 1 is a partial cross-sectional view of an embodiment of the multilayer system made in accordance with the present invention.

FIG. 2 is a partial cross-sectional view of another embodiment of the multilayer system including a capping layer.

DETAILED DESCRIPTION OF THE INVENTION

Figure 3:
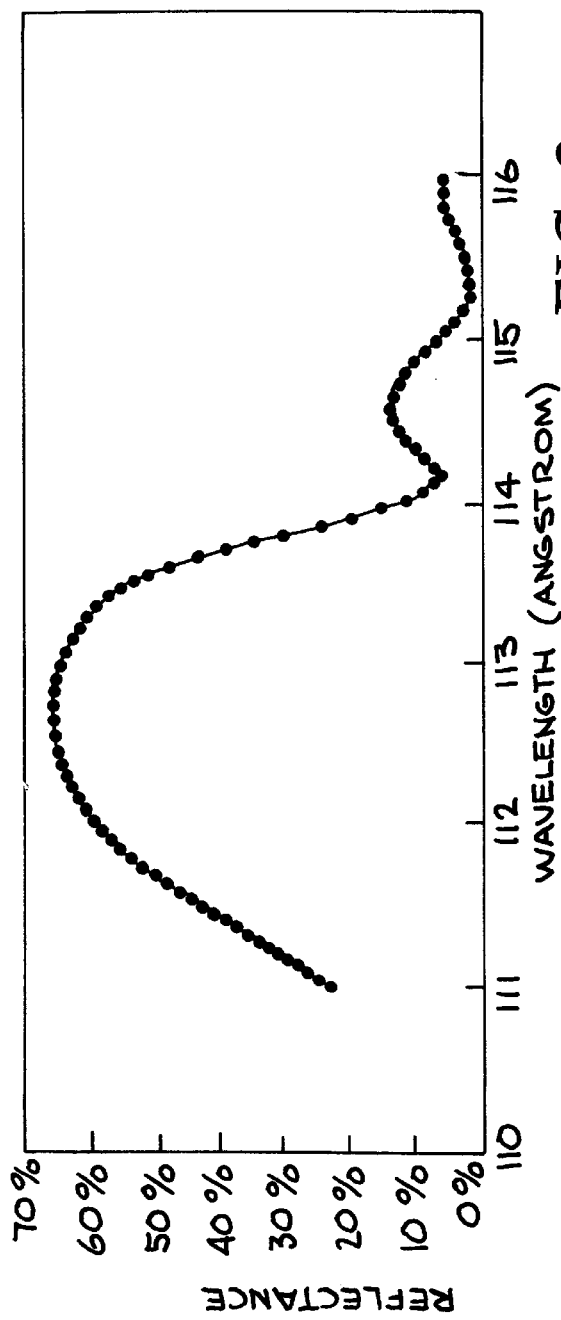
FIG. 3 graphically illustrates the reflectance of a Be/Mo$_2$C multilayer with a reflectance of 65.05% at the 112.5 Å (11.25 nm) wavelength, the Be edge being at 111.2 Å.

The present invention is directed to high reflectance and low stress EUV multilayers that reflect at about 11.3 nm composed of alternating layers of a material pair combination of Mo$_2$C and Be. The multilayer system is deposited by DC magnetron sputtering on a low roughness substrate (<0.6 nm rms), such as silicon (100), which may be used as an optic or for other applications. A reflectance of 65.05% at 11.25 nm measured at 5 degrees off normal incidence angle has been achieved with this material pair combination. The FWHM bandwidth was 0.29 nm. The $Mo_2C/Be$ multilayer system may be capped with a thin layer of carbon. Carbon capped multilayers have an average 7% (absolute %) higher reflectivity than the multilayers with no carbon capping material, but otherwise the same bilayer composition. The stress of the $Mo_2C/Be$ multilayer is tensile and only +88 MPa, which is very low compared to +330 MPa of the as-deposited Mo/Be multilayers of the same thickness.

The $Mo_2C$ layers of the $Mo_2C$ and Be material pair combination are nano-crystalline (amorphous), while the Be layers are substantially crystalline. The formation of a beryllium carbide at the $Mo_2C/Be$ interfaces both stabilizes and has a smoothing effect on the interface. The interfaces appear to be smoother than the interfaces in Mo/Be multilayers. In addition, it is expected that the interfaces will be more stable than the Mo/Be interfaces but complete testing has not yet made this verification.

One problem in the experimental verification of the $Mo_2C/Be$ multilayers has been to obtain a good sputtering target of $Mo_2C$, and the target used in the verification was made of hot pressed Mo and C powder and the density of the target was only about 85–87% of the theoretical density. A pure $Mo_2C$ deposited film was analyzed by Auger spectroscopy and Rutherford backscattering spectroscopy and it indicated that the major impurity in the $Mo_2C$ film was oxygen. This impurity limited the highest reflectivity of $Mo_2C/Be$ multilayers achievable. If an ideal $Mo_2C/Be$ multilayer (no surface oxidation, no interface diffusion and roughness) could be made, it has been calculated that such a multilayer should have a reflectivity of 73%. In this calculation, experimentally determined densities for $Mo_2C$ and Be were used. If one takes into account the surface oxidation, then the calculated reflectivity drops to about 69%. Imperfect interfaces and impurities reduce this reflectivity percentage down further. However, experiments using a carbon capping layer on the $Mo_2C/Be$ multilayer, which protects the surface or outer layer from oxidation, showed that an increase in reflectivity of up to 7% can be obtained while producing a stable multilayer.

The present invention involves a high reflectivity and low stress $Mo_2C/Be$ multilayers that reflect in EUV region (11.25 nm), just above the absorption edge (Be K-edge of 111.5 eV), and have a reflectivity of at least 65% and a stress of only +88 MPa. As pointed out above, high resolution TEM images show that the reaction between Be and the nano-crystalline $Mo_2C$ has a smoothing effect on the interfaces. The interfaces appear almost symmetric, with the interface Be-on-$Mo_2C$ slightly smoother than the interface $Mo_2C$-on-Be. All measurements at the EUV wavelength were done at 5 degrees off normal incident angle. Two $Mo_2C$ and Be multilayer compositions, described hereinafter, have been experimentally verified, and it is anticipated that higher reflectivity will be obtained with improved deposition techniques and target materials, with a potential reflectance of 70% based on theoretical calculations, discussed above.

The first approach is illustrated in FIG. 1 with the results graphically shown in FIG. 3. In this embodiment the $Mo_2C$/Be multilayer generally indicated at 10 is deposited on a substrate 11 with a first deposited or bottom layer 12 being Be and the second deposited layer 13 of a bilayer 14 being $Mo_2C$; and with the last deposited or top layer 15 being Be. Each bilayer 14 has a $Mo_2C$-on-Be interface 16, and each adjacent bilayer having a Be-on-$Mo_2C$ interface 17. The top bilayer pair indicated at 18 also has a Be-on-$Mo_2C$ interface 17. As set forth above, the Be-on-$Mo_2C$ interface 17 appears slightly smoother than the $Mo_2C$-on-Be interface 16. The multilayer 10 may have a range of thicknesses depending on the desired application. For example, the multilayer 10 may consist of 70 bilayers with a deposition period (thickness) of 5.78 nm. By way of example, the thickness of Be layer 12 may be 3.35 to 3.37 nm, and the thickness of $Mo_2C$ layer 13 may be 2.43 to 2.46 nm. The embodiment of FIG. 1, with a first and last (bottom and top) Be layer increased the reflectivity between 3 and 6% over a multilayer having an $Mo_2C$ first and last layers. Since the top or last deposited Be layer 15 reacts with oxygen in air, it forms a BeO surface which causes a decrease in reflectivity. As shown in FIG. 3, the Be/$Mo_2C$ bilayer arrangement of FIG. 1 results in a reflectance (R) of 65.4% at a wavelength (Lambda) of 112.5 Å (11.25 nm).

A specific example of the FIG. 1 embodiment of a $Mo_2C/Be$ multilayer which produced a reflectivity 65.05% and an as-deposit tensile stress of +88 MPa at a wavelength of 11.25 nm, consisted of 70 bilayers with a deposition period or thickness of 5.78 nm (Be layer thickness of about 3.35 nm, and $Mo_2C$ layer thickness of about 2.43 nm), was deposited at 0.83 mTorr sputtering pressure in an argon environment. An HRTEM cross sectional view revealed that the $Mo_2C$ layers were nano-crystalline while the Be layers were substantially crystalline. Since the $Mo_2C$ layers were nano-crystalline, they produced sharp interfaces, with the interdiffusion layer in the range of 0.1–0.2 nm. The interfaces looked almost symmetric with the interface Be-on-$Mo_2C$ slightly smoother than the $Mo_2C$-on-Be. Thermal annealing of this tested multilayer at 200° C. for 2+ hours increased the stress to +242 MPa, which is lower than the +330 MPa stress of as deposited Mo/Be multilayers. Mo/Be stress would also increase when submitted to thermal annealing.

Based on XRD, RBS and Auger spectroscopy tests on the above 70 bilayer $Mo_2C/Be$ multilayer, it was concluded that the main reasons for lower than theoretical reflectance is the density and the presence of oxygen in the $Mo_2C$ layers. Using the measured density value for $Mo_2C$, the estimated interface roughness of 0.2 nm, and the 3 nm of BeO on the top surface, the highest theoretical reflectivity achievable is 68%. Thus, efforts were directed to reducing the oxygen caused reduction in reflectivity, which resulted in the approach illustrated in FIGS. 2 and 4.

As shown in FIG. 2, the second approach comprises a multilayer 20 deposited on a substrate 21, with a first deposited or bottom layer 22 of Be, as in the FIG. 1 embodiment, with a second deposited layer 23 of $Mo_2C$, but with the last deposited or top layer being $Mo_2C$. As in FIG. 1, layers 22 and 23 form bilayers 24 having an interface 26, with each adjacent bilayer pair having an interface 27, but the top bilayer pair 28 has an $Mo_2C$-on-Be interface as does the first deposited bilayer pair 24. In the FIG. 2 embodiment the multilayer 20 includes a thin capping layer 29 of carbon having a thickness of 2.0 to 3.0 nm.

Figure 4:
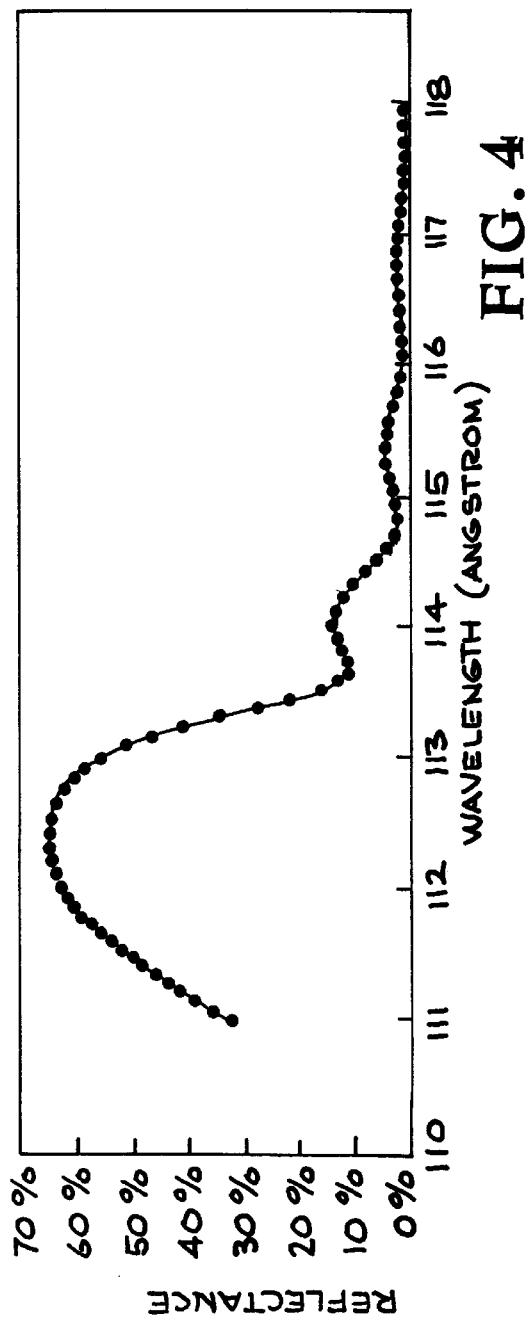
FIG. 4 graphically illustrates the reflectance of an Mo$_2$C/Be+C multilayer with a 65.4% reflectance at the 112.5 Å (11.25 nm) wavelength, the Be edge being at 111.2 Å.

In experimental verification of the carbon capped multilayer of FIG. 2, the capped multilayer gave an average 7% higher reflectivity than the same multilayers without carbon caps. The absolute reflectance varied with the thickness of the carbon capping layer. The highest reflectivity achieved on the multilayers that had a carbon cap was 65.4% at 11.25 nm. The highest reflectivity on an uncapped multilayer with a $Mo_2C$ top or outer layer was 58.2% at 11.2 nm. FIG. 4 graphically shows the $Mo_2C/Be+C$ multilayer with a reflectance (R)=65.4% at a wavelength (Lambda)=112.5 Å (11.25 nm). The carbon capping layer prevents the surface oxidation of the top Mo2C layer and should substantially increase the long term stability of the multilayers.

Figure 5:
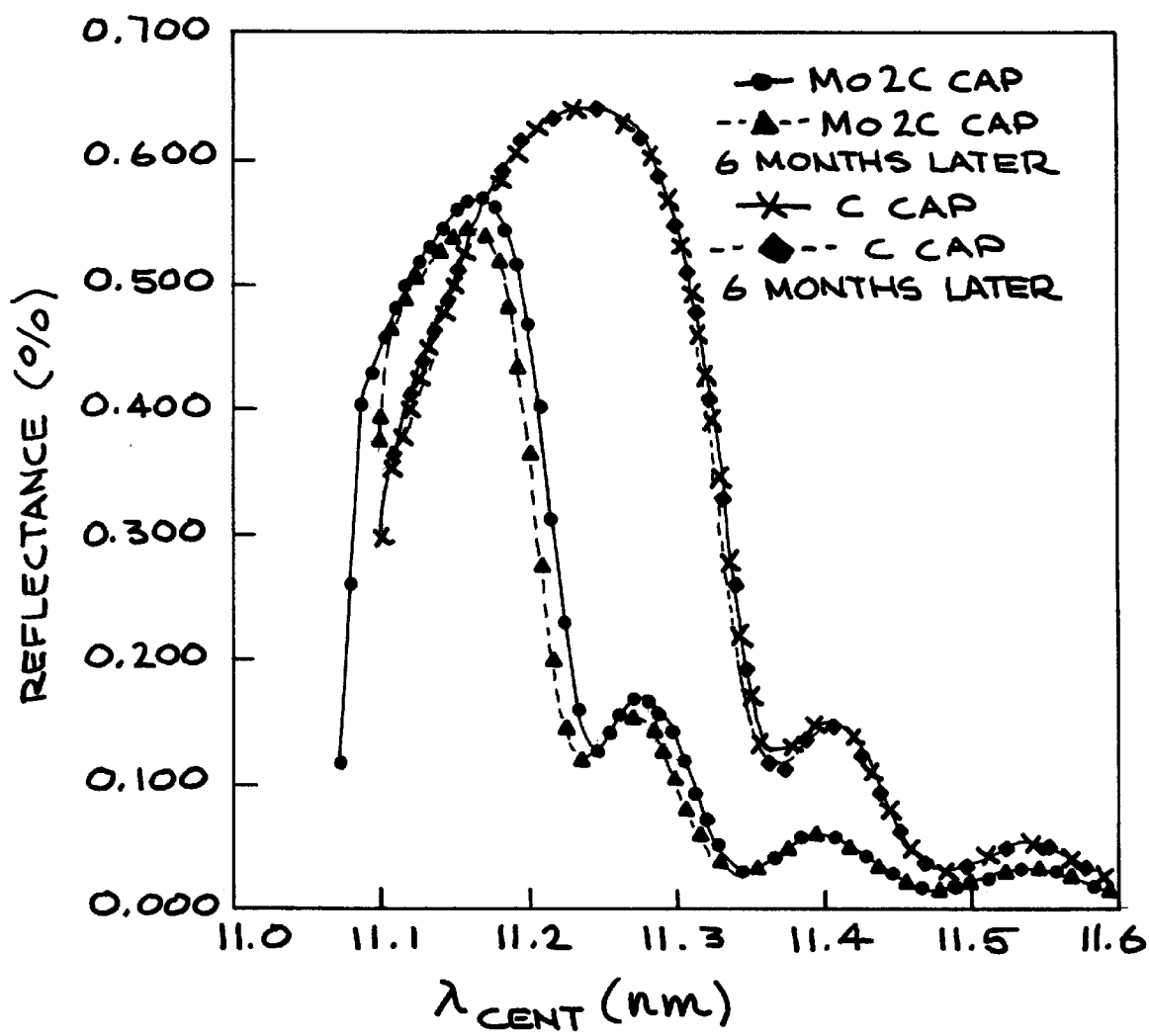
FIG. 5 graphically illustrates the long term reflectance stability of a Mo$_2$C1Be multilayer with a reflectance of 58.3% at 11.16 nm.

FIG. 5 shows the long term reflectance stability of a $Mo_2C$/Be multilayer with a reflectance of 58.3% at 11.16 nm and the same multilayer measured six months later having reflectance of 55.6% at 11.16 nm. In addition, the long term stability of a $Mo_2C$/Be multilayer capped with a carbon layer is displayed. Initially this multilayer had a reflectance of 64.0% at 11.24 nm and after 6 months the reflectance was 63.9% at 11.24 nm.

Experiments have been carried out using a thin (about 1.2 nm) carbon cap on outer Be layer, but the carbon capped Be still oxidized to about the same extent as uncapped Be, apparently because the Be and C react and form beryllium carbide ($Be_2C$), and thus carbon capping of Be is not effective for preventing oxidation of the outer layer.

It has thus been shown that the present invention provides stable, high reflectance, and low stress multilayer that reflect at about 11.1–11.5 nm using a new material pair combination; namely, $Mo_2C$ and Be. The multilayer may be deposited on an optical surface or on a substrate. A reflectance of 65% with a stress of +88 MPa has been achieved thus far although a reflectance near 70% appears to be obtainable upon control of oxidation and obtaining higher purity $Mo_2C$ targets for DC magnetron sputtering. By use of a thin carbon capping layer, surface oxidation is reduced and reflectance increased. This invention provides a useful coating in the near 11 nm wavelength regime for diagnostics and imaging systems, such as the EUV lithography system, as well as providing protective layers especially where low stress (stability) is important.

While particular embodiments of the invention along with specific parameters, etc. have been illustrated and/or described, such are not intended to be limiting. Modifications and changes may become apparent to those skilled in the art, and it is intended that the invention be limited only by the scope of the appended claims.

What is claimed is:

1. A high reflectance, low stress, stable multilayer consisting of alternating layers of $Mo_2C$ and Be,
   the alternate layers having beryllium carbide interfaces, and
   the alternate layers having reflectance of at least 65% and a stress of less than 100 MPa.

2. The multilayer of claim 1, wherein the alternate layers of $Mo_2C$ and Be have a bottom and top layer of Be.

3. The multilayer of claim 1, wherein the alternate layers of $Mo_2C$ and Be have a bottom layer of Be and a top layer of $Mo_2C$.

4. The multilayer of claim 3, additionally including a layer of carbon on the top layer of $Mo_2C$.

5. The multilayer of claim 4, wherein the layer of carbon has a thickness of 2.0 to 3.0 nm.

6. The multilayer of claim 4, having a reflectance of greater than 65% at a wavelength of about 11.2–11.5 nm.

7. The multilayers of claim 1, wherein the alternate layers of Be have a thickness of 3.35 to 3.37 nm, and wherein the alternate layers of $Mo_2C$ have a thickness of 2.43 to 2.46 nm.

8. The multilayer of claim 1, comprising about seventy bilayers of $Mo_2C$/Be, a reflectance of over 65% at a wavelength of 11.25 nm, and a tensile stress of about +88 MPa.

9. The multilayer of claim 8, wherein the stress is increased to about +242 MPa after thermal annealing.

10. In an EUV lithography system having a plurality of multilayer reflective optics the improvement comprising:
    said multilayer reflective optics having a reflectance of over 65% and a stress of less than 100 MPa, and comprising alternating layers of material consisting of $Mo_2C$ and Be,
    said alternating layers having beryllium carbide interfaces.

11. The improvement of claim 10, wherein at least one of said multilayer reflective optics consists of alternating Be and $Mo_2C$ layers with an outer layer of Be.

12. The improvement of claim 10, wherein at least one of said multilayer reflective optics consists of alternating Be and $Mo_2C$ layers with an outer layer of $Mo_2C$, and a capping layer of carbon.

13. The improvement of claim 12, wherein the capping layer of carbon has a thickness of 2.0 to 3.0 nm.

14. A method for forming an optic having a substrate with a multilayer thereon, having a reflectance of at least 65% and a stress of less than 100 MPa, comprising:
    providing a substrate, and
    depositing by DC magnetron sputtering a multilayer of alternating layers consisting of $Mo_2C$ and Be,
    said alternating layers having beryllium carbide interfaces.

15. The method of claim 14, additionally including depositing a layer of carbon on the multilayer.

16. The method of claim 14, wherein the depositing is carried out by first depositing a layer of Be on the substrate.

17. The method of claim 14, wherein the depositing is carried out by depositing last a layer of Be.

18. The method of claim 14, wherein the depositing is carried out by depositing last a layer of $Mo_2C$.

19. The method of claim 18, additionally including depositing a capping layer of carbon on the last deposited layer of $Mo_2C$.

* * * * *